(12) United States Patent
Tanaami et al.

(10) Patent No.: US 12,399,072 B2
(45) Date of Patent: Aug. 26, 2025

(54) METHOD FOR PRODUCING FORCE SENSOR

(71) Applicant: SINTOKOGIO, LTD., Nagoya (JP)

(72) Inventors: Yoshikane Tanaami, Nagoya (JP); Miyuki Hayashi, Nagoya (JP); Akimasa Nakao, Toyokawa (JP)

(73) Assignee: SINTOKOGIO, LTD., Aichi (JP)

( * ) Notice: Subject to any disclaimer, the term of this patent is extended or adjusted under 35 U.S.C. 154(b) by 335 days.

(21) Appl. No.: 17/851,691

(22) Filed: Jun. 28, 2022

(65) Prior Publication Data

US 2023/0031860 A1   Feb. 2, 2023

(30) Foreign Application Priority Data

Jul. 29, 2021  (JP) .................... 2021-124610

(51) Int. Cl.
*G01L 1/22* (2006.01)
*G01G 3/14* (2006.01)
*H01L 21/027* (2006.01)

(52) U.S. Cl.
CPC ........ *G01L 1/2293* (2013.01); *H01L 21/0274* (2013.01); *G01G 3/1402* (2013.01)

(58) Field of Classification Search
CPC . G01L 1/2293; H01L 21/0274; G01G 3/1402; G01B 7/18; G03F 7/00
See application file for complete search history.

(56) References Cited

U.S. PATENT DOCUMENTS

| 6,195,881 B1 * | 3/2001 | Giardina | H05K 3/0052 29/846 |
| 2018/0217016 A1 | 8/2018 | Inamori et al. | |

FOREIGN PATENT DOCUMENTS

| JP | S61-292022 A | 12/1986 |
| JP | H09-304006 A | 11/1997 |
| JP | 2019-164161 A | 9/2019 |

OTHER PUBLICATIONS

Japanese Office Action for Japanese Patent Application No. 2021-124610 issued on Mar. 25, 2025.

* cited by examiner

*Primary Examiner* — Jason L Vaughan
(74) *Attorney, Agent, or Firm* — Harness, Dickey & Pierce, P.L.C.

(57) ABSTRACT

A method for producing a force sensor is a method for producing a force sensor that includes a plate-shaped member (base material) and a strain gauge made of a conductor film, the method including: a first step (see (c)) of forming a conductor layer on one of main surfaces of the plate-shaped member (base material) via a dielectric layer; and a second step (see (d)) of processing the conductor film into the strain gauges by a semiconductor transfer production method.

6 Claims, 3 Drawing Sheets

A-A

A-A

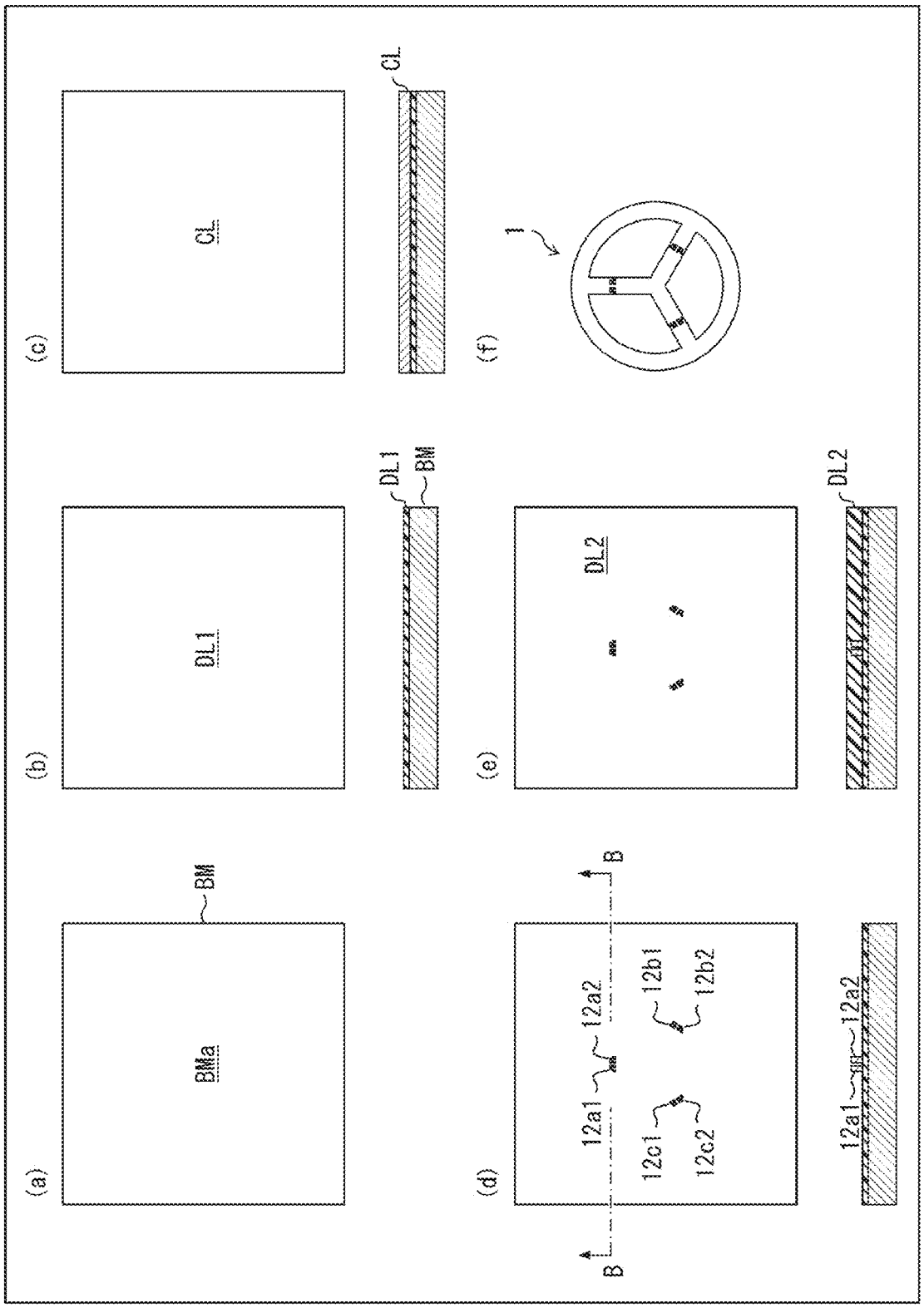

METHOD FOR PRODUCING FORCE SENSOR

This Nonprovisional application claims priority under 35 U.S.C. § 119 on Patent Application No. 2021-124610 filed in Japan on Jul. 29, 2021, the entire contents of which are hereby incorporated by reference.

TECHNICAL FIELD

The present invention relates to a force sensor and a method for producing the force sensor.

BACKGROUND ART

There has been known a force sensor including (i) a strain element being made of a metal and having a deformable part that can be deformed by external force and (ii) a plurality of strain gauges mounted to the deformable part, the force sensor using the strain gauges to detect the external force.

FIG. 1 of Patent Literature 1 illustrates a strain gauge that can be mounted to the strain element in such a force sensor. The strain gauge in accordance with Patent Literature 1 includes a base material made of a resin material, a metal resistor and a pair of tabs provided on the base material, and a fusion layer provided on one of main surfaces of the base material which is opposite to the other one of the main surfaces on which the resistor is provided. By fusion-bonding the base material to the strain element via the fusion layer, it is possible to mount the strain gauges to the strain element.

Note that the resistor and the pair of tabs in the above strain gauge are respectively read as a gauge body and a pair of electrodes constituting a strain gauge herein. Hereinafter, the resistor and the pair of tabs are respectively called the gauge body and the pair of electrodes, and the gauge body and the pair of electrodes are collectively called the strain gauge.

CITATION LIST

Patent Literature

[Patent Literature 1]
Japanese Patent Application Publication, Tokukai, No. 2019-164161

SUMMARY OF INVENTION

Technical Problem

Incidentally, the gauge body has a pattern obtained by causing a uniaxially extending metal thin wire to turn (be bent at 180°) plural times at predetermined intervals. In the description below, such a shape will be called a meander shape.

The resistor having a meander shape, such as the one described above, and the pair of tabs do not have a strength with which the resistor and the pair of tabs can maintain their shapes by themselves, and therefore are provided on the base material. That is, the base material is a support member supporting the strain gauge.

As described in paragraph 0024 of Patent Literature 1, the base material is a plate-shaped member being made of a resin material and having flexibility. Examples of the resin material encompass polyimide, polyamide-imide, polyethylene, and polyetheretherketone. The base material made of any of these resin materials does not have adhesiveness. Thus, according to Patent Literature 1, a fusion layer, which is a different member from the base material, is provided to mount the strain gauge to the strain element.

Paragraphs 0024 and 0027, etc. of Patent Literature 1 state that the base material has a thickness of approximately 12 μm to approximately 25 μm and the fusion layer has a thickness of 3 μm to 12 μm. Thus, in a case where the strain gauge is mounted to the strain element of the technique disclosed in Patent Literature 1, a dielectric layer having a thickness of at least 15 μm is interposed between the strain gauge and the strain element.

In a case where the strain element is made of a metal, a dielectric layer is required between the strain gauge and the strain element to insulate the strain gauge and the strain element from each other. However, from the viewpoint of enhancing the sensitivity of the strain gauge, the thickness of the dielectric layer is preferably thin. The reason for this is as follows. As the thickness of the dielectric layer increases, the strain gauge becomes poor at conforming to deformation of the strain element, and accordingly the sensitivity of the strain gauge is deteriorated.

An aspect of the present invention was made in view of the above-described problem, and has an object to provide a force sensor having a higher sensitivity than in the conventional techniques.

Solution to Problem

In order to attain the above object, a method in accordance with an aspect of the present invention for producing a force sensor is a method for producing a force sensor that includes a plate-shaped member and a strain gauge made of a conductor film, the method including: a first step of forming a conductor layer directly or indirectly on one of main surfaces of the plate-shaped member; and a second step of processing the conductor layer into the strain gauge by a semiconductor transfer production method.

In order to attain the above object, a force sensor in accordance with an aspect of the present invention includes: a strain element formed of a plate-shaped member; and a strain gauge that is a conductor pattern provided, directly or via a dielectric layer, on one of main surfaces of the plate-shaped member, the dielectric layer being a single layer.

Advantageous Effects of Invention

In accordance with an aspect of the present invention, it is possible to provide a force sensor having a higher sensitivity than those of the conventional force sensors.

BRIEF DESCRIPTION OF DRAWINGS

FIG. 5 is a view schematically illustrating a flow of a method for producing a force sensor in accordance with Embodiment 2 of the present invention.

DESCRIPTION OF EMBODIMENTS

Embodiment 1

Figure 1:
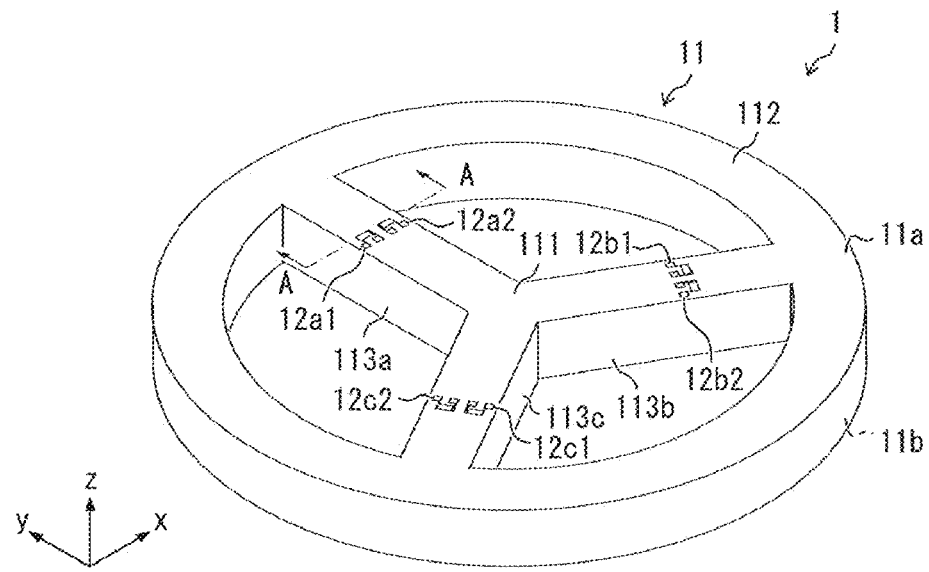
FIG. 1 is a perspective view of a force sensor in accordance with Embodiment 1 of the present invention.
Figure 2:
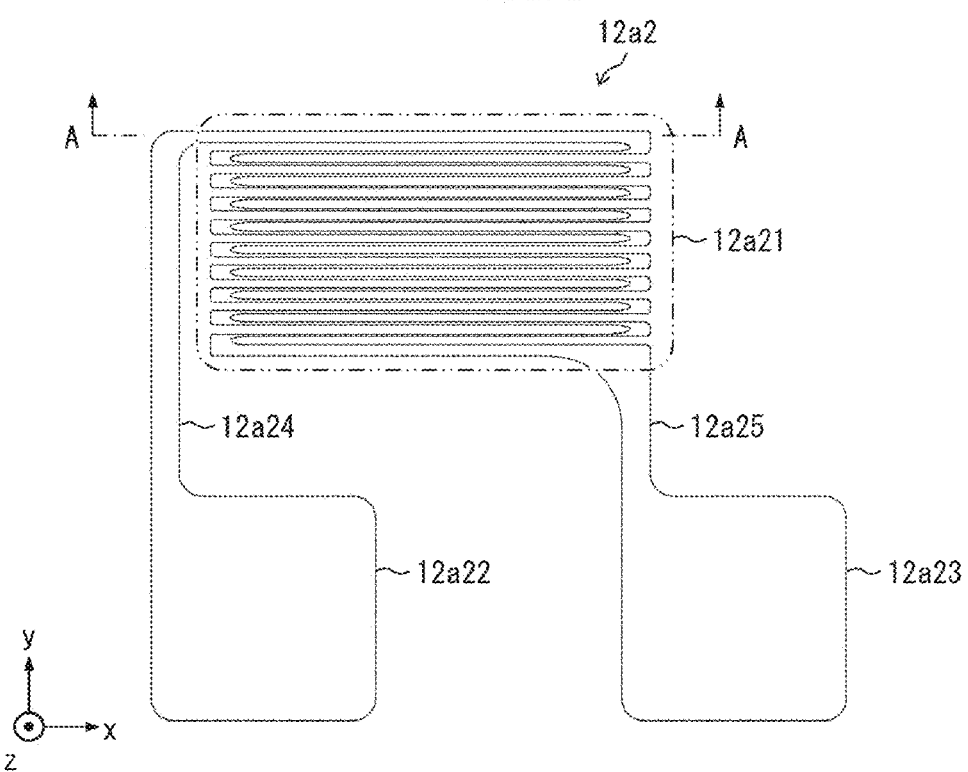
FIG. 2 is a plan view of a strain gauge included in the force sensor illustrated in FIG. 1.
Figure 3:
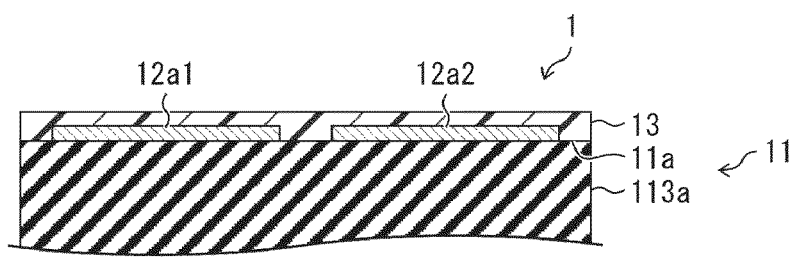
FIG. 3 is an enlarged cross-section view of a portion of the force sensor shown in FIG. 1 which portion includes strain gauges.

The following description will discuss, with reference to FIGS. 1 to 3, a force sensor 1 in accordance with Embodiment 1 of the present invention. FIG. 1 is a perspective view of the force sensor 1. FIG. 2 is a plan view of a strain gauge included in the force sensor 1. FIG. 3 is an enlarged cross-section view of a portion of the force sensor 1 which portion includes strain gauges 12a1 and 12a2. The enlarged cross-section view shown in FIG. 3 is obtained by cutting the force sensor 1 along a line A-A shown in FIGS. 1 and 2, and is viewed in a direction indicated by the arrows in FIGS. 1 and 2. The line A-A is a straight line passing through a gauge body 12a21, which constitutes the strain gauge 12a2. To be more specific, the line A-A is a straight line passing through a portion of the gauge body 12a21 having a meander shape, the portion extending along an x-axis direction. The gauge body 12a21 will be described later with reference to FIG. 2. Note that, in Embodiment 1, directions in the gauge body 12a21 are defined as follows. Specifically, a direction extending from the electrode 12a22 to the electrode 12a23 is defined as an x-axis positive direction, a direction in which wires 12a24 and 12a25 respectively extend from the electrodes 12a22 and 12a23 is defined as a y-axis positive direction, and a z-axis positive direction is defined to constitute an orthogonal coordinate system of the right-handed system together with the x-axis positive direction and the y-axis positive direction (see FIG. 2).

The force sensor 1 is a six-axis force sensor, and includes a strain element 11 and a strain gauge group including six strain gauges 12a1, 12a2, 12b1, 12b2, 12c1, and 12c2.

Here, the six-axis force sensor refers to a force sensor capable of detecting the following components of an external force: an x-axis direction component, a y-axis direction component, a z-axis direction component, a moment component about the x-axis, a moment component about the y-axis, and a moment component about the z-axis. Note that the strain element 11 is disposed so that two main surfaces of the strain element 11 are in parallel with an xy-plane. One of the paired main surfaces of the strain element 11 which is on the z-axis positive direction side is called a main surface 11a, and the other of the paired main surfaces of the strain element 11 which is on the z-axis negative direction side is called a main surface 11b.

Note that the force sensor 1 is one example of the force sensor in accordance with an aspect of the present invention. The force sensor in accordance with an aspect of the present invention is not limited to the force sensor 1. A configuration of the force sensor in accordance with an aspect of the present invention is applicable to existing force sensors. For example, a configuration of the force sensor in accordance with an aspect of the present invention is applicable to the force sensor shown in FIGS. 1 and 2 of Japanese Patent Application, Tokugan, No. 2019-068598.

The force sensor 1 includes, in addition to the strain element 11 and the strain gauges 12a1, 12a2, 12b1, 12b2, 12c1, and 12c2, a plurality of resistor elements and a plurality of bridge circuits. However, the description in Embodiment 1 will discuss the strain element 11 and the strain gauges 12a1, 12a2, 12b1, 12b2, 12c1, and 12c2, and does not discuss the plurality of resistor elements and the plurality of bridge circuits. Configurations of the plurality of resistor elements and the plurality of bridge circuits may be as those of existing force sensors (e.g., the force sensor shown in FIGS. 1 and 2 of Japanese Patent Application, Tokugan, No. 2019-068598).

The strain element 11 is a plate-shaped member made of a material with a spring property. As shown in FIG. 1, the strain element 11 includes a core portion 111, a frame portion 112 surrounding the core portion 111, and arm portions 113a to 113c via which the core portion 111 and the frame portion 112 are connected to each other. A material of which the strain element 11 is made may be (i) an electric conductor such as an aluminum alloy, an alloy steel or (ii) a stainless steel or a dielectric such as a ceramic material, a resin, or glass, for example. In Embodiment 1, the strain element 11 is made of a ceramic material, which is one example of the dielectric.

A method for forming the strain element 11 may be, for example, machining of a base material that is a single plate-shaped member having a uniform thickness, as will be described in the later-explained production method. The machining may be cutting, for example. The cutting is preferably numerical controlled (NC) machining. Note that, if external force is exerted on the core portion 111 while the frame portion 112 is in a fixed state, the arm portions 113a to 113c undergo a strain that varies in accordance with that external force. Therefore, the core portion 111 may be referred to as "force receiver", and the frame portion 112 may be referred to as "fixing portion".

There is no particular limitation on the shape of the core portion 111. In Embodiment 1, the core portion 111 is in the shape of a pole with a substantially triangle base (i.e., substantially in the shape of a triangular pole). There is no particular limitation on the shape of the frame portion 112, as well. In Embodiment 1, the frame portion 112 is in the shape of a ring. The frame portion 112 has an outer peripheral portion and an inner peripheral portion that have a substantially circular shape and that are concentric to each other. As described above, the strain element 11 is formed by machining a single base material having a uniform thickness. Thus, a thickness of the core portion 111 is substantially equal (in Embodiment 1, equal) to a thickness of the frame portion 112. The core portion 111 is disposed inside the inner peripheral portion of the frame portion 112 such that a center of gravity of the core portion 111 coincides with a center of the frame portion 112 which is in the shape of a ring.

In Embodiment 1, the arm portions 113a to 113c are each in the shape of a pole having a substantially rectangular base and extending along one direction (i.e., substantially in the shape of a quadrangular pole). There is no limitation on the number of arm portions 113a to 113c. In Embodiment 1, the number of arm portions 113a to 113c is three. The arm portion 113a extends from the core portion 111 in the y-axis positive direction so as to connect the core portion 111 with the frame portion 112. The arm portion 113b extends, in the xy-plane, from the core portion 111 in a direction at an angle of −120° relative to the y-axis positive direction (i.e., at an angle of 120° clockwise from the y-axis negative direction) so as to connect the core portion 111 with the frame portion 112. The arm portion 113c extends, in the xy-plane, from the core portion 111 in a direction at an angle of +120° relative to the y-axis positive direction (i.e., at an angle of 120° counterclockwise from the y-axis positive direction) so as to connect the core portion 111 with the frame portion 112.

Note that the shapes of the core portion 111, the frame portion 112, and the arm portions 113a to 113c are not limited to the above-described shapes. For example, the core portion 111, the frame portion 112, and the arm portions 113a to 113c may have the shapes as shown in FIG. 1 of Japanese Patent Application, Tokugan, No. 2019-068598.

The main surface 11a of the strain element 11 has the strain gauges 12a1, 12a2, 12b1, 12b2, 12c1, and 12c2 formed thereon (see FIG. 1). More specifically, the strain gauges 12a1 and 12a2 are formed on a portion of the main surface 11a which portion corresponds to the arm portion 113a (see FIG. 3), the strain gauges 12b1 and 12b2 are formed on a portion of the main surface 11a which portion corresponds to the arm portion 113b, and the strain gauges 12c1 and 12c2 are formed on a portion of the main surface 11a which portion corresponds to the arm portion 113c.

The strain gauges 12a1, 12a2, 12b1, 12b2, 12c1, and 12c2 constitute a conductor pattern made of an electric conductor formed into the shape shown in FIG. 2 as viewed in the z-axis positive direction, which coincides with a direction normal to the main surface 11a. In Embodiment 1, the strain gauges 12a1, 12a2, 12b1, 12b2, 12c1, and 12c2 are made of a Cu—Ni alloy. Note that the electric conductor of which the strain gauges 12a1, 12a2, 12b1, 12b2, 12c1, and 12c2 are made is not limited to the Cu—Ni alloy and may alternatively be a Ni—Cr alloy, for example. The electric conductor can be selected appropriately from electric conductors that can be processed with a method for producing a semiconductor with a transfer technique (i.e., semiconductor transfer production method) (e.g., a photolithography method).

Here, the shapes of the strain gauges 12a1, 12a2, 12b1, 12b2, 12c1, and 12c2 will be described while focusing on the strain gauge 12a2 among these. Note that the strain gauges 12b2 and 12c2 are identical in shape to the strain gauge 12a2. The shapes of the strain gauges 12a1, 12b1, and 12c1 are reflectionally symmetrical with the shape of the strain gauge 12a2 with respect to a yz-plane.

As shown in FIG. 2, the strain gauge 12a2 is constituted by the gauge body 12a21, the pair of the electrodes 12a22 and 12a23, and the pair of the wires 12a24 and 12a25.

The gauge body 12a21 has a pattern obtained by causing a uniaxially extending thin line made of an electric conductor to turn (be bent at 180°) plural times at predetermined intervals. In the description below, such a shape will be called a meander shape. The pattern of the gauge body 12a21 is not limited to the example shown in FIG. 2, and can be designed appropriately.

The wires 12a24 and 12a25, which make a pair, are respectively connected to both side ends of the gauge body 12a21 that is bent into a meander shape. Both the wires 12a24 and 12a25 extend in the y-axis direction. However, the shapes of the wires 12a24 and 12a25 are not limited to those shown in the example shown in FIG. 2, and can be desired appropriately.

The electrodes 12a22 and 12a23, which make a pair, are respectively connected to the wire 12a24 and 12a25. In Embodiment 1, the electrodes 12a22 and 12a23 are each in the shape of a rounded quadrangular shape. Note that the shapes of the electrodes 12a22 and 12a23 are not limited to those shown in the example of FIG. 2, and can be designed appropriately.

In Embodiment 1, a dielectric layer 13 is provided over the main surface 11a and upper surfaces of the strain gauges 12a1, 12a2, 12b1, 12b2, 12c1, and 12c2 except for the electrode 12a22 or 12a23 (see FIG. 3). Note that, in order to clearly illustrate a configuration of the strain gauges 12a1, 12a2, 12b1, 12b2, 12c1, and 12c2, FIG. 1 does not show the dielectric layer 13.

The dielectric layer 13 is made of a dielectric such as a resin (e.g., a polyimide resin or an epoxy resin) that can be used in a semiconductor transfer production method (e.g., a photolithography method). The dielectric layer 13 protects the strain gauges 12a1, 12a2, 12b1, 12b2, 12c1, and 12c2.

In Embodiment 1, the strain gauges 12a1, 12a2, 12b1, 12b2, 12c1, and 12c2 are formed only on the main surface 11a, which is one of the main surfaces of the strain element 11. Alternatively, in an aspect of the present invention, the plurality of strain gauges may be formed not only on the main surface 11a but also on the main surface 11b, which is the other one of the main surfaces of the strain element 11. That is, in an aspect of the present invention, the plurality of strain gauges may be provided on both the main surfaces 11a and 11b of the strain element 11.

Variation

Figure 4:
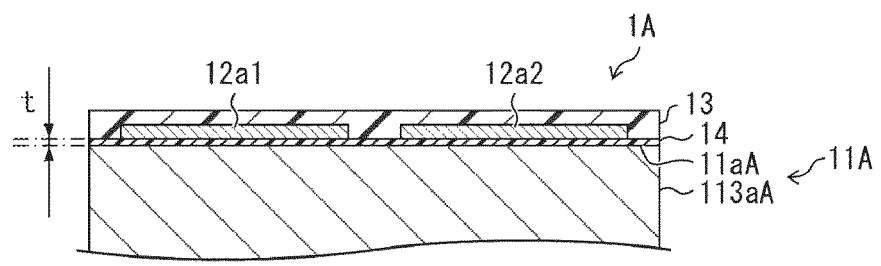
FIG. 4 is an enlarged cross-section view of a portion of a variation of the force sensor shown in FIG. 1 which portion includes strain gauges.

The following description will discuss, with reference to FIG. 4, a force sensor 1A, which is a variation of the force sensor 1. FIG. 4 is an enlarged cross-section view of a portion of the force sensor 1A which portion includes strain gauges 12a1 and 12a2.

As illustrated in FIG. 4, the force sensor 1A can be obtained by making the following modifications to the force sensor 1 shown in FIG. 3.

A first modification is to replace the strain element 11, which is made of a dielectric, with a strain element 11A, which is made of an electric conductor. A second modification is to provide a dielectric layer 14 between (i) the main surface 11aA, which is one of the main surfaces of the strain element 11A, and (ii) the strain gauges 12a1, 12a2, 12b1, 12b2, 12c1, and 12c2 and the dielectric layer 13.

In the present variation, the strain element 11A is made of an aluminum alloy, which is one example of the electric conductor. Note that the material of the strain element 11A only needs to be an electric conductor. For example, the strain element 11A may be made of an alloy steel or a stainless steel.

The dielectric layer 14 insulates the strain element 11A from the strain gauges 12a1, 12a2, 12b1, 12b2, 12c1, and 12c2. The dielectric layer 13 is made of a dielectric such as a resin (e.g., a polyimide resin or an epoxy resin) that can be processed with a semiconductor transfer production method (e.g., a photolithography method). In the present variation, the dielectric layer 14 is made of a polyimide resin.

The dielectric layer 14 is a single layer produced by a single production process. The dielectric layer 14 is made uniform from a single kind of material.

A thickness t (see FIG. 4) of the dielectric layer 14 can be set as appropriate within a range which allows the dielectric layer 14 to insulate the strain element 11A from the strain gauges 12a1, 12a2, 12b1, 12b2, 12c1, and 12c2 and which is less than a thickness (=15 µm) of the dielectric layer in the force sensor disclosed in Patent Literature 1. However, from the viewpoint of further enhancing the sensitivity of the force sensor 1, the thickness t is preferably as thin as possible within a range with which the insulating property can be maintained. The thickness t is preferably a thickness that can be easily achieved by a semiconductor transfer production method (e.g., a photolithography method). The thickness t is preferably not less than 1 µm and not more than 2 µm. With this configuration, the dielectric layer 14 has a thickness of not less than 1 µm, and thus it is possible to reliably insulate the strain element 11A from the strain gauges 12a1, 12a2, 12b1, 12b2, 12c1, and 12c2. In addition, with this configuration, in which the dielectric layer 14 has a thickness of not more than 2 μm, it is possible to further enhance the sensitivity of the force sensor 1.

Embodiment 2

The following description will discuss, with reference to FIG. 5, a method for producing a force sensor in accordance with Embodiment 2 of the present invention. FIG. 5 is a view schematically illustrating a flow of a production method in accordance with Embodiment 2. (b) to (e) of FIG. 5 illustrate cross-section views taken along a line B-B shown in (d) of FIG. 5. The line B-B is a straight line corresponding to the line A-A shown in FIG. 2.

The production method in accordance with Embodiment 2 is a method for producing the force sensor 1A, which is the variation of Embodiment 1. For convenience of description, a member having a function identical to that of a member discussed in Embodiment 1 is given an identical reference sign, and a description thereof is omitted. (a) to (f) of FIG. 5 are used to describe steps of the production method.

The production method in accordance with Embodiment 2 includes a grinding step, a dielectric layer forming step, a conductor layer forming step, a first photolithography step, a second photolithography step, and a cutting step.

Embodiment 2 uses, as a material from which the strain element 11A is to be formed, a base material BM, which is a plate-shaped member made of an aluminum alloy. In Embodiment 2, the base material BM is in the form of a square. However, the shape of the base material BM is not limited to the square. The description in Embodiment 2 will discuss the production method in accordance with Embodiment 2, taking as an example a case where a single force sensor 1A is produced with use of the base material BM. Here, the number of force sensors 1A to be produced with use of a single base material BM is not limited to one. In a case where a plurality of force sensors 1A are to be produced from a single base material BM, the size of the base material BM may be selected as appropriate in accordance with the number of force sensors 1A to be produced.

The grinding step is a step of grinding main surfaces BMa and BMb, which make a pair of main surfaces of the base material BM (see (a) of FIG. 5). A surface roughness of the main surface BMa after the grinding can be selected as appropriate within a range with which the strain gauges 12a1, 12a2, 12b1, 12b2, 12c1, and 12c2 can be formed by a photolithography method. In Embodiment 2, the main surfaces BMa and BMb are ground so that the main surface BMa achieves a surface roughness (arithmetic mean roughness Ra) of not more than 0.2 μm.

The dielectric layer forming step is a step of spin-coating a dielectric (in Embodiment 2, a polyimide resin) on the main surface BMa to form a dielectric layer DL1 (see (b) of FIG. 5). The dielectric layer forming step is one example of the third step.

The conductor layer forming step is a step of forming a film of an electric conductor (in Embodiment 2, a Cu—Ni alloy) on an upper surface of the dielectric layer DL1 to form a conductor layer CL (see (c) of FIG. 5). The conductor layer forming step is one example of the first step. In the conductor layer forming step, the conductor layer CL is formed by sputtering. In the conductor layer forming step, the method for forming the conductor layer CL is not limited to sputtering, and may alternatively be a vacuum vapor deposition method, for example.

The first photolithography step is a step of processing the conductor layer CL into strain gauges by a photolithography method (see (d) of FIG. 5). The first photolithography step is one example of the second step. The photolithography method is one aspect of the semiconductor transfer production method. The following description will roughly discuss the first photolithography step.

In the first photolithography step, first, a photoresist is spin-coated on an upper surface of the conductor layer CL. Then, the photoresist is subjected to exposure in a state where a mask is set on the photoresist. The mask used in this process has a mask pattern corresponding to the pattern of the strain gauges 12a1, 12a2, 12b1, 12b2, 12c1, and 12c2. As a result of the exposure, the pattern of the strain gauges 12a1, 12a2, 12b1, 12b2, 12c1, and 12c2 is transferred onto the photoresist. There is no limitation on a wavelength of light used in the exposure. The wavelength of the light used in the exposure can be selected as appropriate in accordance with the fineness of the pattern of the strain gauges 12a1, 12a2, 12b1, 12b2, 12c1, and 12c2. That is, the lithography method employed in the first photolithography step may be a photolithography method or an electron beam lithography method. In Embodiment 2, the photolithography method is employed. Then, the photoresist having been subjected to the exposure is developed. Consequently, the photoresist corresponding to the pattern of the strain gauges 12a1, 12a2, 12b1, 12b2, 12c1, and 12c2 is left on the upper surface of the conductor layer CL. Next, a portion of the conductor layer CL which portion is uncovered with the photoresist is etched by a wet process. Consequently, the conductor layer CL is patterned into the shapes of the strain gauges 12a1, 12a2, 12b1, 12b2, 12c1, and 12c2. Thereafter, the photoresist left on the upper surface of the conductor layer CL is removed.

The second photolithography step is a step of forming, with use of a photolithography method, a protection layer which covers the gauge body (e.g., the gauge body 12a21) and the pairs of wires (e.g., the wires 12a24 and 12a25) of each strain gauge (e.g., the strain gauge 12a2) and which does not cover the pair of electrodes (e.g., the electrodes 12a22 and 12a23) (see (e) of FIG. 5). The following description will roughly discuss the second photolithography step.

In the second photolithography step, first, a photoresist is spin-coated on upper surfaces of the strain gauges. Then, the photoresist is subjected to exposure in a state where a mask is set on the photoresist. The mask used in this process has a mask pattern corresponding to the pattern of the pairs of electrodes of the strain gauges. As a result of the exposure, the pattern of the pairs of the electrodes is transferred onto the photoresist. Then, the photoresist having been subjected to the exposure is developed. Consequently, the photoresist corresponding to the pattern of the pairs of electrodes is left on the upper surface of the conductor layer CL. Next, a dielectric (in Embodiment 2, a polyimide resin) is spin-coated on the upper surfaces of the strain gauges and the photoresist. Consequently, a dielectric layer DL2 is formed. Then, the photoresist corresponding to the pairs of electrodes is lifted off.

The cutting step is a step of obtaining the strain element 11A by cutting-machining of the base material BM having the main surface BMa on which the strain gauges 12a1, 12a2, 12b1, 12b2, 12c1, and 12c2 are formed (see (f) of FIG. 5). The cutting step is one example of the fourth step. As a result of the cutting step, the force sensor 1A is completed.

As described above, the production method in accordance with Embodiment 2 is a method for producing the force sensor 1A that includes (i) the base material BM which is a plate-shaped member made of an electric conductor and (ii) the strain gauges 12a1, 12a2, 12b1, 12b2, 12c1, and 12c2 which are made of a conductor film.

The production method in accordance with Embodiment 2 includes the conductor layer forming step of forming the conductor layer CL indirectly on the main surface BMa and the first lithography step of processing the conductor layer CL into the strain gauges 12a1, 12a2, 12b1, 12b2, 12c1, and 12c2 by a lithography method, which is an aspect of the semiconductor transfer production method.

With the production method in accordance with Embodiment 2, the conductor layer CL directly or indirectly formed on one (BMa) of the main surfaces of the base material BM can be processed into the strain gauges by the lithography method. This makes it possible to omit the fusion layer provided between (i) the resistor and the pair of tabs and (ii) the base material in the technique disclosed in Patent Literature 1. Thus, the force sensor 1A produced by the production method in accordance with Embodiment 2 includes the strain element 11A made of the base material BM and the strain gauges 12a1, 12a2, 12b1, 12b2, 12c1, and 12c2, which is the conductor pattern formed on the main surface 11aA via the dielectric layer 14 that is a single layer. In the force sensor 1A, a distance from the strain gauges 12a1, 12a2, 12b1, 12b2, 12c1, and 12c2 to the strain element 11A can be made shorter than in conventional ones. This can enhance the sensitivity of the force sensor 1A. Note that, in the production method in accordance with Embodiment 2, the semiconductor transfer production method is not limited to the lithography method.

In the production method in accordance with Embodiment 2, the base material BM is made of an electric conductor. The production method in accordance with Embodiment 2 further includes the dielectric layer forming step of forming the dielectric layer DL1 directly on the main surface BMa, the dielectric layer forming step being carried out before the conductor layer forming step. In the conductor layer forming step, the conductor layer CL is formed on the main surface BMa only via the dielectric layer DL1.

In the force sensor 1A produced by the production method in accordance with Embodiment 2, only the dielectric layer DL1 is present between the strain gauges 12a1, 12a2, 12b1, 12b2, 12c1, and 12c2 and the base material BM. As compared to the base material adopted in the technique disclosed in Patent Literature 1 that serves as the support member supporting the resistor and the pair of tabs, the dielectric layer DL1, which does not serve as a support member, can be made thinner. Thus, the force sensor 1A can not only omit the fusion layer but also have the dielectric layer DL1 thinner than the base material. This can further enhance the sensitivity of the force sensor 1A.

In the production method in accordance with Embodiment 2, the lithography method is employed as the semiconductor transfer production method.

The production method in accordance with Embodiment 2 further includes, after the first lithography step, the cutting step of obtaining the strain element 11A by cutting-machining of the base material BM on which the strain gauges 12a1, 12a2, 12b1, 12b2, 12c1, and 12c2 are formed.

According to the lithography method employed in the second step, a resist is applied on the conductor layer CL, the resist is subjected to exposure so as to have a pattern of the strain gauges 12a1, 12a2, 12b1, 12b2, 12c1, and 12c2 which pattern is defined at the time of designing, and the resist is developed. Consequently, the predetermined pattern is formed on the conductor layer CL. In the step of the exposure, in order to carry out the exposure so as to precisely obtain the predetermined pattern, it is preferable that the resist have a thickness as uniform as possible.

Meanwhile, assume a case where (i) a strain element is obtained in advance by cutting-machining of a plate-shaped member, (ii) a conductor layer is formed on one of main surfaces of the strain element, and then (iii) the conductor layer is processed into strain gauges by a lithography method. In such a case, due to plural recesses on the one of the main surfaces, a resist would have different film thicknesses in different positions in the one of the main surfaces. This may often deteriorate the accuracy in the exposure in the above-described exposure step.

Thus, the force sensor 1A produced by the production method in accordance with Embodiment 2 can achieve a pattern of the strain gauges 12a1, 12a2, 12b1, 12b2, 12c1, and 12c2 which pattern is close to the pattern determined at the time of designing, as compared to the case where the strain element is obtained in advance by cutting-machining of the plate-shaped member.

Variation

The description in Embodiment 2 has dealt with the case where the force sensor 1A is produced. The production method in accordance with Embodiment 2 is favorably applied also to produce the force sensor 1. In this case, the above-described production method may be modified as follows.

A first modification is to use, as the material from which the base material BM is to be formed, a dielectric (e.g., a ceramic material) in place of an electric conductor (e.g., an aluminum alloy). A second modification is to omit the dielectric layer forming step and to form, in the conductor layer forming step, a conductor layer CL directly on a main surface BMa.

In Embodiment 2, the strain gauges 12a1, 12a2, 12b1, 12b2, 12c1, and 12c2 are formed only on the main surface BMa. Alternatively, a plurality of strain gauges may be formed not only on a main surface BMa but also on a main surface BMb. In this case, similar steps to the dielectric layer forming step, the conductor layer forming step, the first photolithography step, and the second photolithography step carried out on the main surface BMa may be carried out also on the main surface BMb, and then the cutting step may be carried out.

Embodiment 2 employs the lithography method in the step of processing the conductor layer CL into the strain gauges. In the step of processing the conductor layer CL into the strain gauges, a nano-imprinting method may be employed instead of the lithography method. Each of the lithography method and the nano-imprinting method is one aspect of the semiconductor transfer production method.

As described above, the production method in accordance with the variation of Embodiment 2 is a method for producing the force sensor 1 that includes (i) the base material BM which is a plate-shaped member and (ii) the strain gauges 12a1, 12a2, 12b1, 12b2, 12c1, and 12c2 which are made of a conductor film.

The production method in accordance with the variation of Embodiment 2 includes a conductor layer forming step of forming a conductor layer CL directly on a main surface BMa and a first lithography step of processing the conductor layer CL into strain gauges 12a1, 12a2, 12b1, 12b2, 12c1, and 12c2 by a photolithography method, which is one example of the semiconductor transfer production method.

In the production method in accordance with the variation of Embodiment 2, the base material BM is made of a dielectric, and the conductor layer CL is formed directly on the main surface BMa in the conductor layer forming step.

As described above, in a variation of the present invention, a material from which the base material BM is to be formed is not limited to an electric conductor, but may alternatively be a dielectric such as a ceramic material. In a case where the base material BM is made of a dielectric, strain gauges 12a1, 12a2, 12b1, 12b2, 12c1, and 12c2 can be provided directly on one (BMa) of main surfaces of the base material BM. Thus, in the force sensor 1 produced by the production method in accordance with the variation of Embodiment 2, a distance from the strain gauges 12a1, 12a2, 12b1, 12b2, 12c1, and 12c2 to the strain element 11 can be made zero. This can further enhance the sensitivity of the force sensor 1.

Supplementary Remarks

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

BM: base material (plate-shaped member)
BMa: main surface (one of main surfaces of plate-shaped member)
CL: conductor layer
DL1, DL2: dielectric layer
1: force sensor
11: strain element
11a: main surface (one of main surfaces of strain element)
12a1, 12a2, 12b1, 12b2, 12c1, 12c2: strain gauge
13: dielectric layer

The invention claimed is:

1. A method for producing a force sensor that includes a plate-shaped member and a strain gauge made of a conductor film, the plate-shaped member being made of an electric conductor, the method comprising:
a third step of forming a dielectric layer directly on one of main surfaces, the dielectric layer having a thickness of not less than 1 μm and not more than 2 μm;
a first step of forming a conductor layer on the one of main surfaces of the plate-shaped member via the dielectric layer;
a second step of processing the conductor layer into the strain gauge by a semiconductor transfer production method; and
a fourth step of obtaining a strain element by cutting-machining of the plate-shaped member, the strain element having a deformable part that is deformed by an external force, the strain gauge being mounted to the deformable part, the fourth step being carried out after the second step.

2. The method as set forth in claim 1, wherein
the semiconductor transfer production method is a lithography method.

3. The method as set forth in claim 1, further comprising, before the third step, a step of grinding the main surfaces of the plate-shaped member so that the one of the main surfaces on which the conductor layer is to be formed achieves an arithmetic mean roughness of not more than 0.2 μm.

4. A method for producing a force sensor that includes a plate-shaped member and a strain gauge made of a conductor film,
the plate-shaped member being made of a dielectric, the method comprising:
a first step of forming a conductor layer directly on one of main surfaces of the plate-shaped member;
a second step of processing the conductor layer into the strain gauge by a semiconductor transfer production method; and
a fourth step of obtaining a strain element by cutting-machining of the plate-shaped member, the strain element having a deformable part that is deformed by an external force, the strain gauge being mounted to the deformable part, the fourth step being carried out after the second step.

5. The method as set forth in claim 4, wherein the semiconductor transfer production method is a lithography method.

6. The method as set forth in claim 4, further comprising, before the third step, a step of grinding the main surfaces of the plate-shaped member so that the one of the main surfaces on which the conductor layer is to be formed achieves an arithmetic mean roughness of not more than 0.2 μm.

* * * * *